United States Patent [19]

Wu et al.

[11] Patent Number: 4,992,253
[45] Date of Patent: Feb. 12, 1991

[54] PROCESS FOR PRODUCING AN ULTRAFINE POWDER OF ALUMINUM NITRIDE

[75] Inventors: Nan-Chung Wu; Huei-Jung Wang, both of Tainan, Taiwan

[73] Assignee: National Science Council, Taipei, Taiwan

[21] Appl. No.: 459,426

[22] Filed: Dec. 29, 1989

[51] Int. Cl.$^5$ .......................................... C01B 21/072
[52] U.S. Cl. ................................................... 423/412
[58] Field of Search ....................................... 423/412

[56] References Cited

U.S. PATENT DOCUMENTS

| | | | |
|---|---|---|---|
| 3,572,992 | 3/1971 | Komeya et al. | 423/412 |
| 3,718,490 | 2/1973 | Morgan et al. | 423/412 |

FOREIGN PATENT DOCUMENTS

| | | | |
|---|---|---|---|
| 91019 | 5/1983 | Japan | 423/412 |
| 59-207814 | 11/1984 | Japan . | |
| 176910 | 9/1985 | Japan | 423/412 |
| 180906 | 9/1985 | Japan | 423/412 |
| 132711 | 6/1987 | Japan | 423/412 |
| 210004 | 8/1988 | Japan | 423/412 |

Primary Examiner—Wayne A. Langel
Attorney, Agent, or Firm—Birch, Stewart, Kolasch & Birch

[57] ABSTRACT

Disclosed is a process for producing an ultrafine powder of aluminum nitride. This process is characterized in adding 1-5 wt % of aluminum nitride powder to the mixture of alumina and carbon black and heating the resulting powder mixture at a temperature of 1550°–1650° C. in an atmosphere of nitrogen. Preferably, prior to heating, the powder mixture is shaped into a compact. The aluminum nitride powder prepared by the process of the present invention has an average particle diameter of about 0.45 micron and a purity of above 98.1%, and is therefore a very suitable material for making printed circuit boards and heat release boards for IC, LSI and VLSI.

10 Claims, 15 Drawing Sheets 1.6/1  $\overline{1\mu m}$ 1.8/1  $\overline{1\mu m}$ 2.0/1  $\overline{1\mu m}$ 2.5/1  $\overline{1\mu m}$ 2.83/1  $\overline{1\mu m}$ NO ADDITION  1μm 1wt%  1μm 3wt%  1μm 5wt%  1μm FIG. 12A
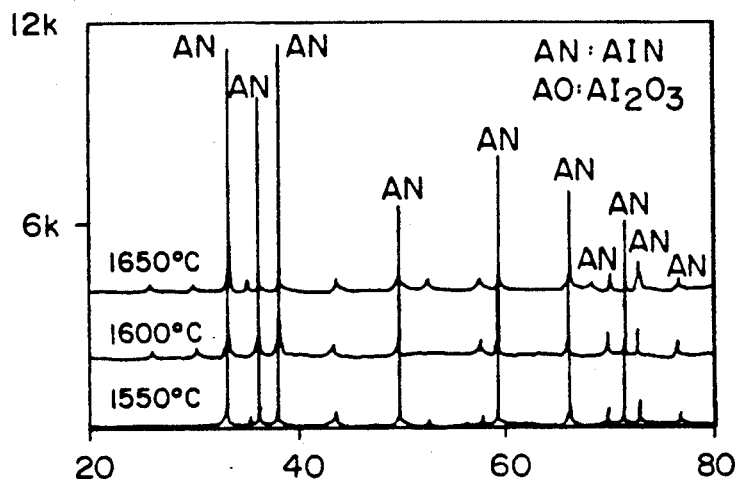
FIG. 12B
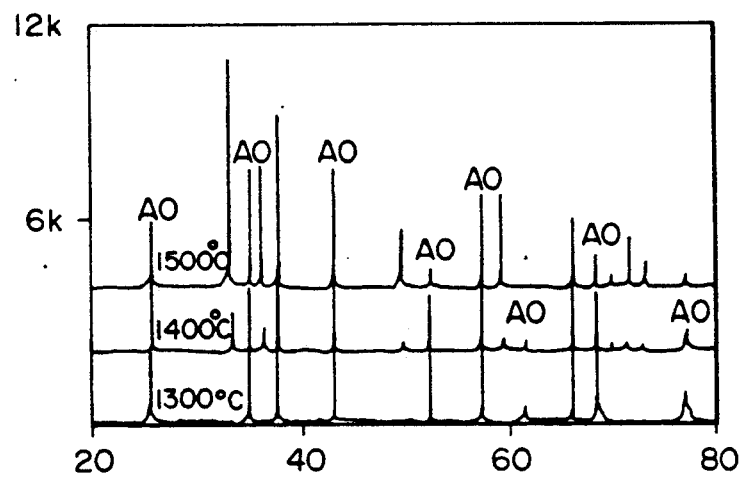
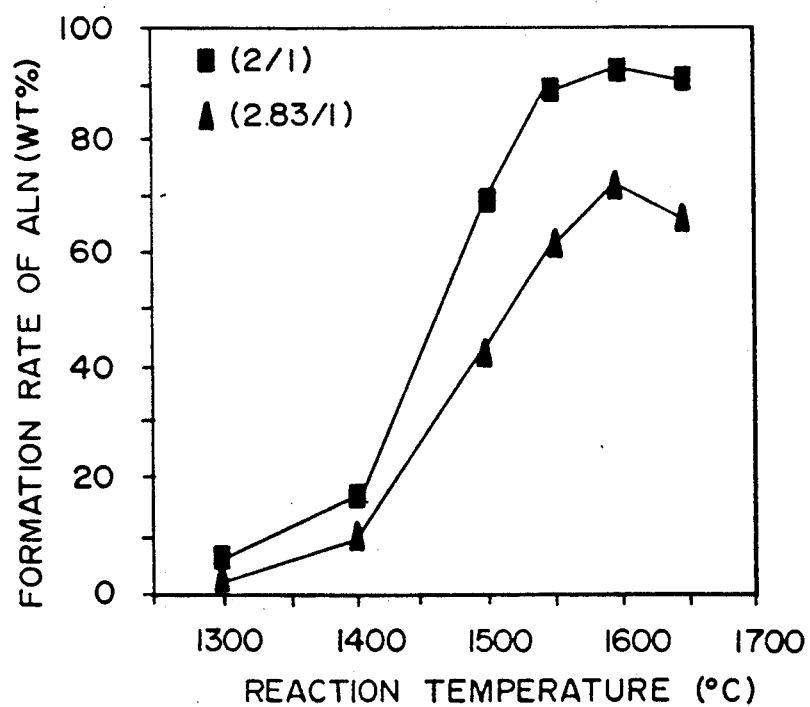
FIG. 14

1300°C

1400°C

1500°C

1550°C

1600°C

1650°C

1hr

3hrs

5hrs

7hrs

10hrs

12hrs 20 c.c./min. 1μm 30 c.c./min. 1μm 50 c.c./min. 1μm 100 c.c./min. 1μm

PROCESS FOR PRODUCING AN ULTRAFINE POWDER OF ALUMINUM NITRIDE

BACKGROUND OF THE INVENTION

The present invention relates to a process for producing a powder of aluminum nitride, and in particular relates to a process for producing a powder of aluminum nitride having an average particle diameter of about 0.45 micron.

As it has a high thermal conductivity, an excellent electric insulating property, a coefficient of thermal expansion close to silicon single crystals, a low dielectric constant, the sintered aluminum nitride is a very suitable material for making printed circuit boards and heat release boards of the IC (integrated circuit), LSI (large scale integrated circuit) and VLSI (very large scale integrated circuit).

In general, two methods are used for the production of aluminum nitride powders. The first method is called direct nitriding method, which comprises nitriding metallic aluminum powder at a high temperature in an atmosphere of nitrogen or ammonia gas and pulverizing the resulting nitride. The second method is called the alumina reducing method, which comprises firing alumina and carbon powder in nitrogen or ammonia gas and pulverizing the resulting nitride.

Since metallic aluminum is used as a starting material in the first direct nitriding method, it naturally requires a step of pulverizing metallic aluminum in order to increase the rate of nitridation. Furthermore, to increase the sinterability of the resulting nitride, it requires a step of pulverizing the nitride to a particle size of less than several microns. Therefore, in the direct nitriding method, it is impossible to avoid the inclusion of impurities of metal or metallic compounds from pulverizing means such as a ball mill used in these pulverizing steps. In addition, because the direct nitriding method yields aluminum nitride powders inevitably containing impurities of unreacted metallic aluminum nitride, it is also extremely difficult to obtain aluminum nitride containing less than several percents by weight of impurities including those produced in the pulverizing steps. In the pulverizing step of the direct nitriding method, it is difficult to produce aluminum nitride powder having sufficiently small and uniform particle size. Moreover, since oxidation of the surface of the aluminum nitride powder during pulverization cannot be avoided, the aluminum nitride powder obtained by the direct nitriding method usually contains 2 to 5% by weight or even more of oxygen.

The second alumina reducing method is generally considered to be better than the direct nitriding method in that it gives an aluminum nitride powder having a relatively uniform particle size. But, to obtain particles having a size of less than several microns, the pulverizing step cannot be obviated. Furthermore, the content of the unreacted alumina cannot be reduced to an extreme extent. Accordingly, like the direct nitriding method, the second method also has the defect of yielding an aluminum nitride of low purity. Aluminum nitride powders produced by these methods do not have sufficient purity and generally assume a black to gray color. Therefore, as a general rule, not all sintered bodies obtained from these powders have light-transmitting properties.

In the Japan laid-open Patent Publication No. 59-207814 (Assignee: Tokuyama Soda Co., Ltd.), a process for producing a fine powder of alumina nitride is disclosed. According to the process disclosed in said publication, the produced aluminum nitride has an average particle diameter of less than 2 micron and a purity of at least 94 wt %, and the produced AlN powder can be used directly without further pulverizing steps. However, the average particle diameter of the produced AlN powder according to the process in said publication is not small enough, and the necessary amount of nitrogen gas used according to the process described in said publication is rather large, about 3000 cc/min.

SUMMARY OF THE INVENTION

It is therefore an object of the present invention to provide a process for producing a powder of aluminum nitride having an average particle diameter of about 0.45 micron.

It is another object of the present invention to provide a process for producing a powder of aluminum nitride, for which process the flow rate of the nitrogen gas used is only 100–300 cc/min.

According to the present invention, the process comprises the following steps:

a. intimately mixing α phase fine powder of alumina having an average particle diameter of about 0.48 micron, a fine powder of carbon having an average particle diameter of about 0.18 micron, and a powder of aluminum nitride having a high purity in a liquid dispersing medium, wherein the weight ratio of the fine alumina powder to the fine carbon powder being from 1.6:1 to 2.5:1, and the amount of the aluminum nitride added being 1–5 wt % based on the total weight of the alumina powder and carbon powder;

b. compressing the resulting mixture to a molded article;

c. firing the molded articles at a temperature of 1550° to 1650° C. in an atmosphere of nitrogen; and d. heating the resulting powder at a temperature of 600° to 700° C. for 5–7 hours to remove the unreacted carbon.

BRIEF DESCRIPTION OF THE DRAWINGS

The present invention can be more fully understood by reference to the following detailed description and the accompanying drawings, wherein:

FIG. 12 is the X-ray diffraction diagram of the sample discs obtained by heating compressed powder mixture having a weight ratio of alumina to carbon being 2.0:1 at different temperatures;

FIG. 14 shows the formation rate of the AlN of the synthesized powder under different reaction temperatures;

DETAILED DESCRIPTION OF THE INVENTION

According to the process of the present invention, the alumina used as raw material should be $\alpha$ phase alumina and have an average particle diameter of about 0.48 micron, such as the alumina available from Cricream Co., which is $\alpha$ phase alumina having a purity of 99.9% and an average particle diameter of 0.48 micron. The carbon black powder used should be an amorphous carbon having an average particle diameter of about 0.18 micron. The weight ratio of the fine alumina powder to the fine carbon black powder should be from 1.6:1 to 2.5:1, because it is believed that the following reaction occurs in the alumina reducing reaction:

$$Al_2O_3 + 3C + N_2 \rightarrow 2AlN_{(s)} + 3CO_{(g)}$$

According to this reaction, the theoretical weight ratio of the alumina powder to the carbon black powder should be 2.83. However, in actual experiments, in order to promote the complete reduction of alumina powder, excessive carbon powder is usually added, because it is believed that excessive carbon powder will provide a greater chance for reduction to the $Al_2O_3(g)$ or $AlO(g)$.

Figure 1A:
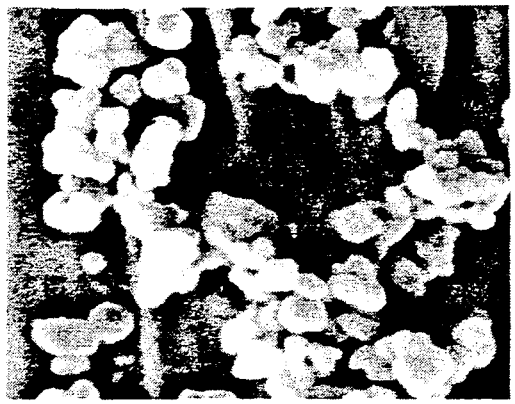
FIGS. 1A, 1B, 1C, 1D and 1E are scanning electron microphotographs of the synthesized powder with different weight ratios of $Al_2O_3/C$.
Figure 1B:
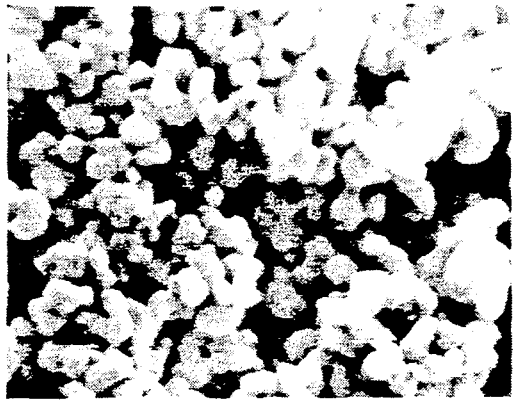
Figure 1C:
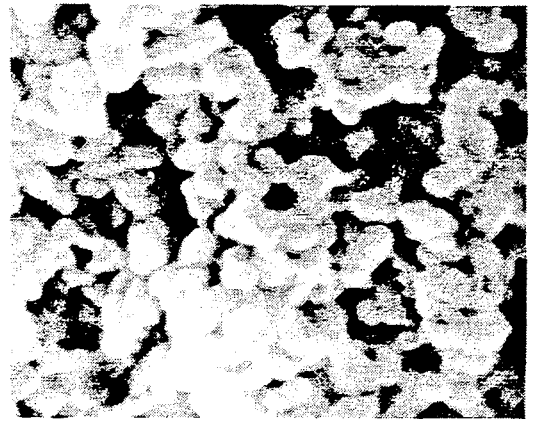
Figure 1D:
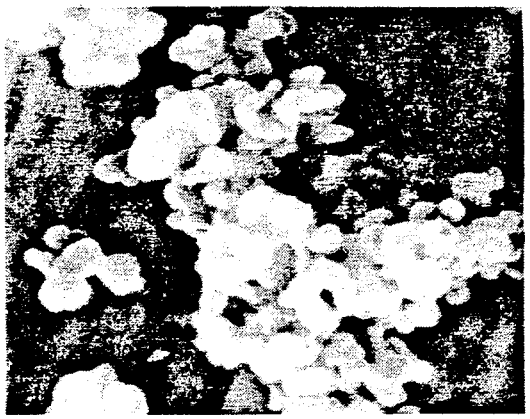
Figure 1E:
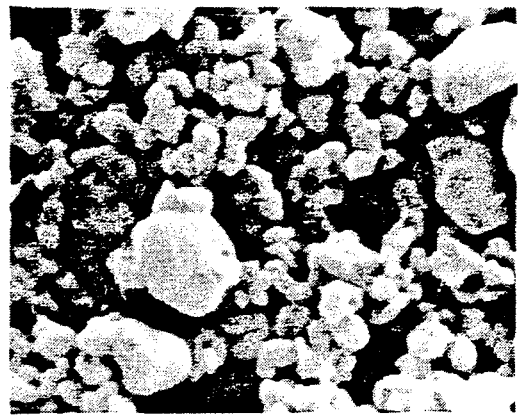
Figure 2:
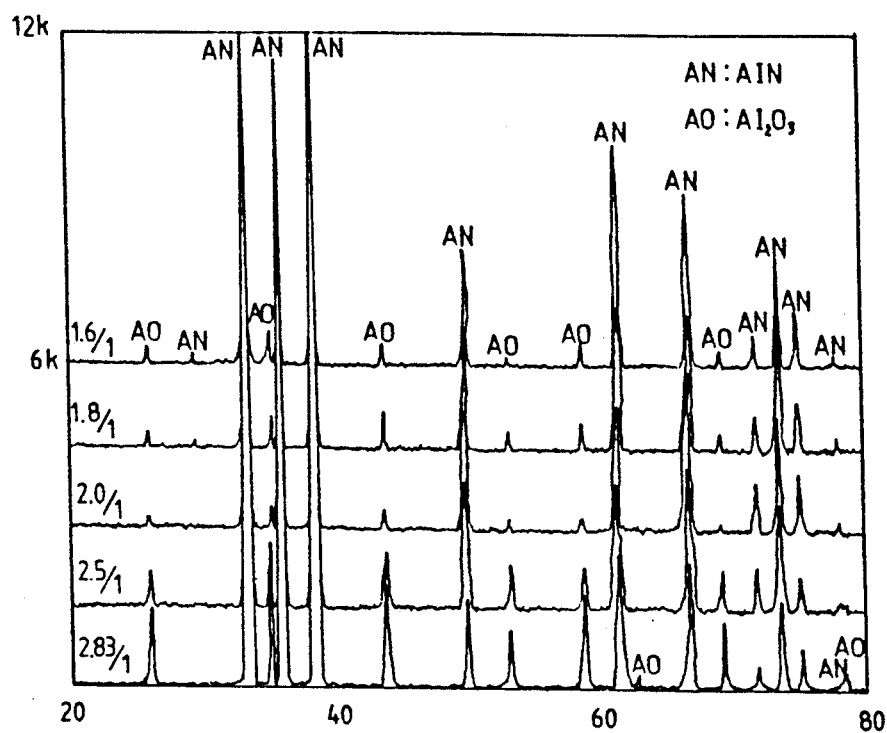
FIG. 2 is an X-ray diffraction diagram of the synthesized powder prepared from powder mixture with different weight ratios of $Al_2O_3/C$ and heated at 1600° C. with a soaking time of 7 hours.

In order to quantify the appropriate weight ratio of the alumina powder to the carbon powder, various powder mixtures in which the weight ratios are respectively 2.83/1, 2.5/1, 2.0/1, 1.8/1 and 1.6/1 are prepared and heated in 1600° C. and 1550° C. with soaking time of 7 hours in an atmosphere of nitrogen gas (flow rate: 200 cc/min). The synthesized aluminum nitride powders are observed under SEM (scanning electronic microscope) and the results are shown in FIGS. 1A, 1B, 1C, 1D and 1E. As shown in FIG. 1A, FIG. 1B and FIG. 1C, the shape of these particles is close to spherical and these particles are almost of the same size. In FIG. 1D, several big particles are observed. In FIG. 1E, many big particles are observed. The synthesized aluminum nitride powders are also subjected to the X-ray diffraction analysis and the result is shown in FIG. 2. From FIG. 2, it is observed that when the weight ratio of $Al_2O_3/C$ is 2.83, strong diffraction peak of alumina appears, and when the weight ratio is 2.0/1, although the diffraction peak of alumina is still present, the peak is apparently weakened.

Although an excessive amount of carbon can promote the reduction reaction, it does not mean that the more the carbon powder present, the more complete the reaction. From FIG. 3, it is known that the most appropriate weight ratio of $Al_2O_3$ is 2.0/1. Naturally, for larger weight ratios (for example, 2.5/1), the chance for complete reduction is weakened. But if the weight ratio is too small (i.e. the excessive amount of carbon is too large), the unreacted carbon will increase; consequently, the time required to remove the unreacted carbon in air is longer. This will increase the exposure time of the aluminum nitride, hence increasing the possibility of the reoxidation of the produced aluminum nitride.

Figure 3:
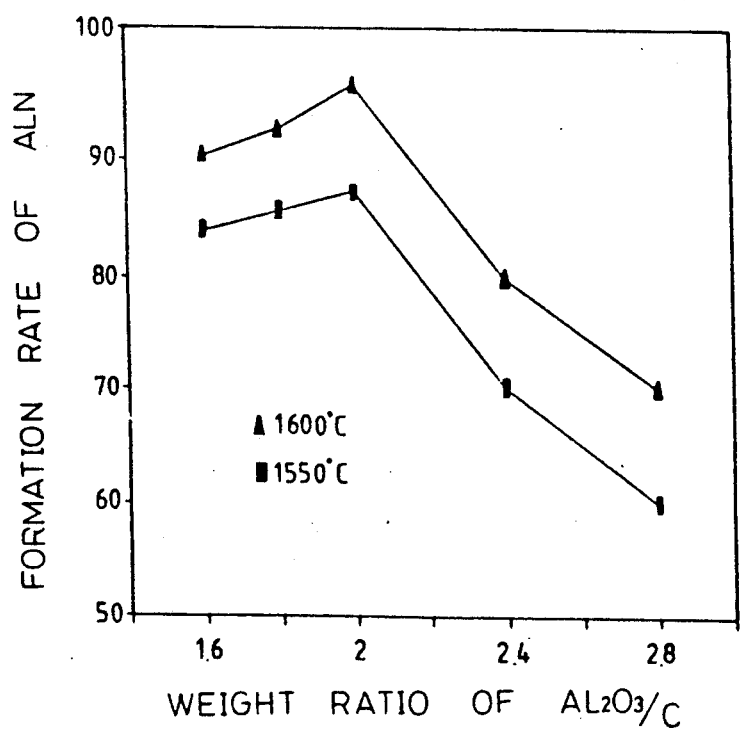
FIG. 3 shows the dependence of the formation rate of AlN upon the weight ratio of $Al_2O_3/C$.
Figure 4A:
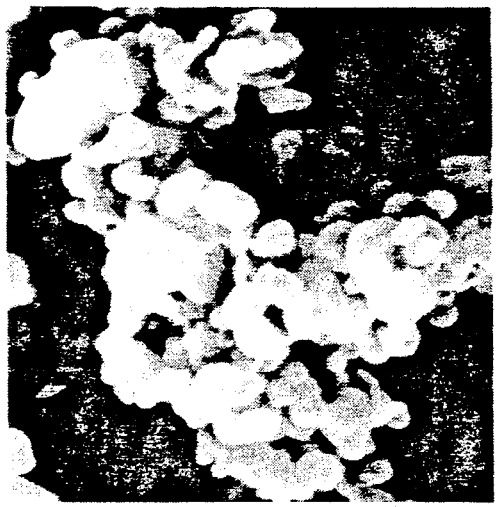
FIGS. 4A, 4B, 4C and 4D are scanning electron microphotographs of the synthesized powder showing the influence of the addition of AlN.
Figure 4B:
Figure 4C:
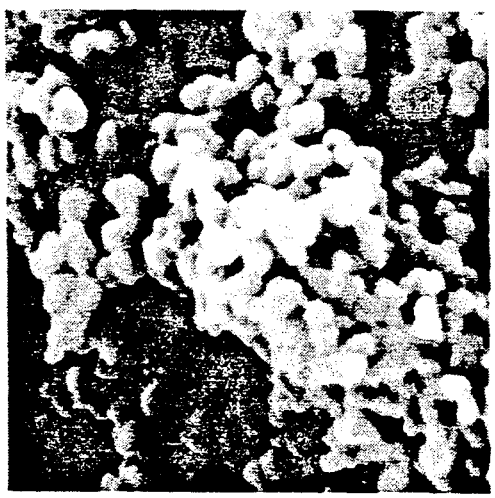
Figure 4D:
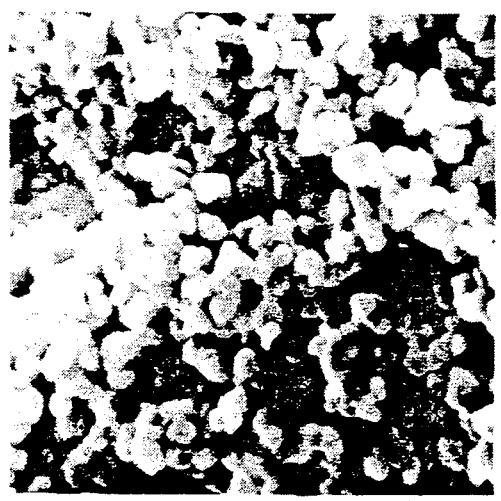

From the results shown in FIG. 2 and FIG. 3, at a temperature of 1600° C., the formation rates of the produced powders, which are prepared from powder mixtures having $Al_2O_3$ weight ratios of 1.6/1, 1.8/1 and 2.0/1, are all above 90 wt %, but for the produced powder which is prepared from a powder mixture having $Al_2O_3$ weight ratio of 2.5/1, the formation rate of AlN is only 80%. As for the produced powder which is prepared from a powder mixture having $Al_2O_3$ weight ratio of 2.83/1, the formation rate of AlN is reduced to 71 wt %. Therefore, the larger particles shown in FIG. 1D and FIG. 1E are probably unreacted alumina particles which grow to larger particles after long-term heat treatment (1600° C., 7 hours).

Figure 5A:
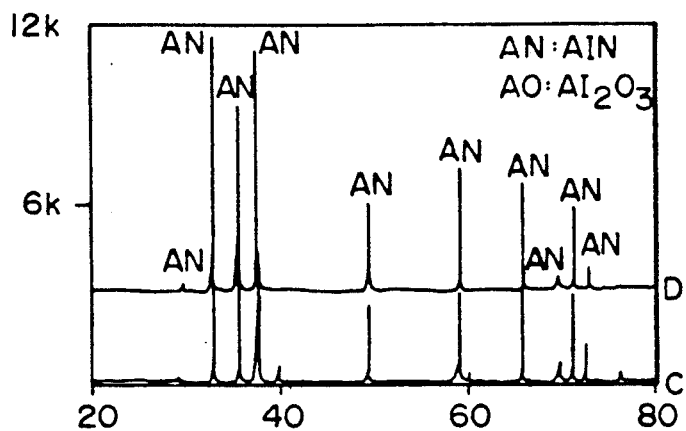
FIG. 5 is an X-ray diffraction diagram showing the influence of the addition of AlN on the reaction.
Figure 5B:
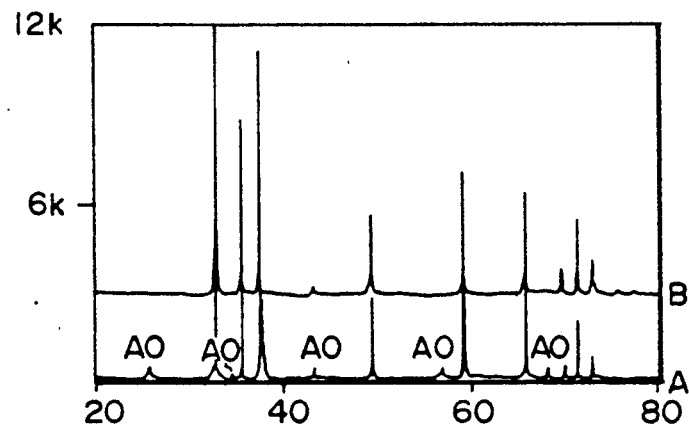

The added aluminum nitride powder should have a purity of above 98.1%, a diameter of about 0.6 micron, and a content of metal impurities of less than 200 ppm. The object of adding aluminum nitride is to provide more nucleation sites during the formation and crystallization of the aluminum nitride so as to make their microstructure become finer. In order to illustrate the effect of the addition of aluminium nitride and the range of weight percent to be added, a powder mixture of alumina and carbon with a weight ratio of 2.0/1 is prepared and divided into (A), (B), (C), and (D) four groups. For (A) group, there is no addition of aluminum nitride. But, for (B), (C), and (D) groups, 1 wt %, 3 wt %, and 5 wt % of aluminum nitride are respectively added. All of these four groups of powder mixture are compressed into several discs under a compression pressure of 2830 kg/cm$^2$. These sample discs are heated at a temperature of 1600° C. in an atmosphere of nitrogen (flow rate: 200 cc/min) for 7 hours. The resulting sample discs are observed under SEM and the results are shown in FIGS. 4A, 4B, 4C and 4D. As shown in FIGS. 4A, 4B, 4C and 4D, the average particle diameter of the produced powder decreases from 1 micron to 0.4 micron as the addition of AlN is increased from 0 wt % to 5 wt %. The produced sample disc are also subjected to the X-ray diffraction analysis and the results are shown in FIG. 5. As observed from FIG. 5, for samples of group A (without the addition of AlN), several diffraction peaks of alumina are present, for samples of group B (1 wt % of AlN), several diffraction peaks of alumina are still present, but their intensity is very weak, for samples of group C (3 wt % of AlN), no diffraction peaks of alumina are present, for samples of group D (5 wt % of AlN), the X-ray diffraction diagram is the same as that of the AlN powder produced by the process described in the Japan laid-open Patent Publication No. 59-207814. Therefore, it is known that the produced AlN powder of the present invention has the same AlN purity as the powder prepared by the process according to said publication.

There is no particular restriction on the liquid dispersing medium used in the mixing step, and any known medium for wet mixing can be used. Generally, hydrocarbons, aliphatic alcohols, and mixture of these are conveniently used. The hydrocarbons include, for example, petroleum ether, hexane, benzene, and toluene, and the aliphatic alcohols include, for example, methanol, ethanol and isopropanol.

Preferably, the above wet mixing is carried out in a device made of a material which does not cause inclusion of impurities in the powder to be mixed. Generally, the wet mixing can be carried out at room temperatures and atmospheric pressure and is not adversely affected by temperature and pressure. Known mixing devices can be employed so long as they do not generate impurities which remain in the product after heating. Generally, a mill containing spherical or rodlike materials is used as the mixing device. Preferably, the inner wall of the mill and the spherical or rod-like materials are made of aluminum nitride itself or highly pure alumina having a purity of at least 99.9% by weight in order to avoid inclusion of impurities in the produced aluminum nitride. The surface of the mixing device which contacts the starting materials can be made of, or coated with, plastics. There is no particular limitation on the plastics used for this purpose and, for example, polyethylene, polypropylene, polyamides, polyesters and polyurethane can be used. Since various metallic stabilizers are used in the plastics, they must be checked before use.

According to the process of the present invention, the resulting mixture of alumina, carbon black and AlN should be shaped into a compact in air. Shaping the mixture into a compact can be carried out by a number of techniques, such as extrusion, injection molding, die pressing and isostatic pressing. This is an important step and a feature of the process of the present invention. Because in the process of mixing, as the diameter of the carbon black (usually 0.16 micron) is smaller than that of the alumina powder (usually 0.48 micron), the alumina powder will be coated by the carbon black powder after mixing. So, if the reaction is carried out by using the powder mixture as it is, the following two disadvantages are present:

(a). As the constant temperature zone in the reaction chamber is usually not large enough, to assure complete reaction of the powder, the powder must be homogeneously placed on the supporting devices; therefore, the quantity of the powder that can be fed into the reaction furnace is limited.

(b). As the contact of the hyper-active carbon black and the alumina is not so intimate, the carbon black may react with the oxygen present in the reaction zone to form carbon dioxide or carbon monoxide before reacting with the alumina. The oxygen may come from the impurities ($H_2O$, $O_2$) contained in the reaction gas or the gas remaining in the reaction zone due to an incomplete vacuum system.

The purpose of shaping the powder mixture into a compact is to make the carbon black and the alumina contact intimately. When the temperature rises gradually, the hyperactive, amorphous carbon black will reduce the alumina, and the carbon monoxide formed due to the reduction process will evaporate and make the shaped article become porous. Although these pores are very fine, they are large enough to allow the entrance of nitrogen molecules.

Figure 7:
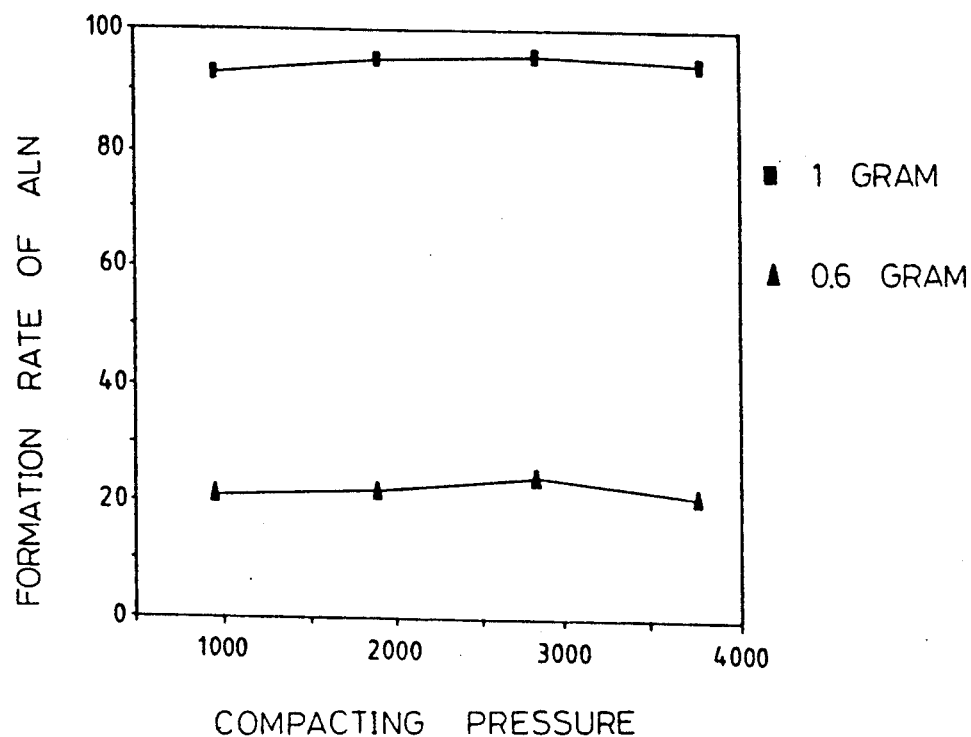
FIG. 7 shows the dependence of the formation rate of the AlN of the synthesized powder upon the compacting pressure.

In order to understand the influence of the compacting pressure on the reaction, two kinds of experimental conditions are selected. For the first group, 1 gram of powder mixture (the weight ratio of alumina to carbon black being 2:1) is compressed and made to react at a temperature of 1600° C. with a soaking time of 7 hours in an atmosphere of nitrogen (flow rate: 200 cc/min). For the second group, except only 0.6 gram of powder mixture is used instead of 1 gram of powder mixture, the same conditions for group 1 are adopted. The result is shown in FIG. 7. FIG. 7 shows the dependence of the formation rate of the AlN of the synthesized powder upon the compacting pressure. As shown in FIG. 7, the curves for both of the two groups are quite flat. This means that when the compacting pressure is within the range of 1000 to 4000 kg/cm$^2$, the formation rate of the produced AlN is almost the same. However, at a compacting pressure of 2830 kg/cm$^2$, the formation rate (purity) of the produced AlN is slightly higher.

Figure 8:
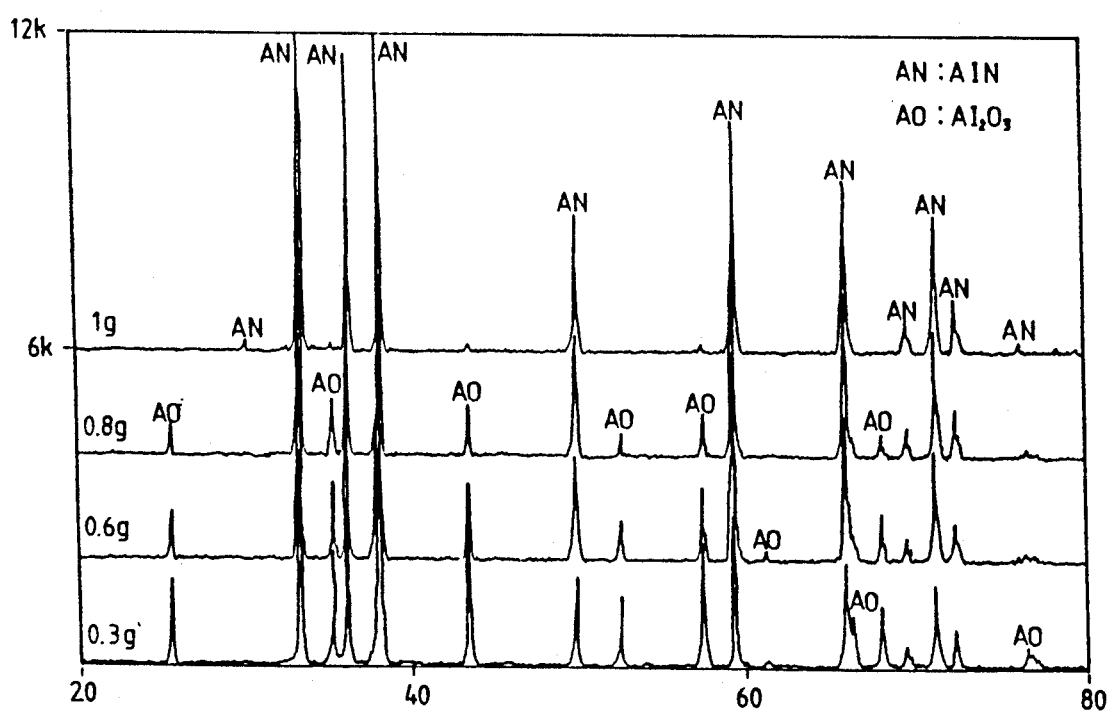
FIG. 8 is an X-ray diffraction diagram showing the influence of the weight of the sample discs on the purity of the synthesized AlN powder.
Figure 9:
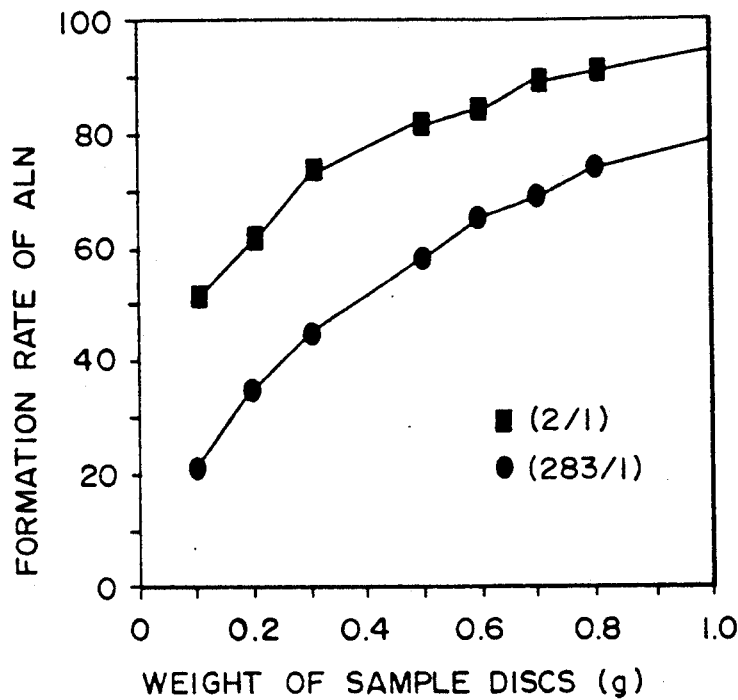
FIG. 9 shows the dependence of the formation rate of AlN upon the weight of the sample discs.

The dependence of the purity of the produced AlN upon the weight of the shaped samples is also investigated. Discs (5 mm in diameter) of various weights are prepared by using powder mixtures having the weight ratio of alumina to carbon black of 2.83/1 and 2.0/1. These discs are formed by using a compacting pressure of 2830 kg/cm$^2$ and react at a temperature of 1600° C. with a soaking time of 7 hours in an atmosphere of nitrogen (flow rate: 200 cc/min). The X-ray diffraction diagram of these sample discs and the purity of the produced AlN as a function of the weight of each disc are respectively shown in FIG. 8 and FIG. 9. For both groups of powder mixture (2.83/1 and 2.0/1), the purity of the produced AlN is increased with the increase in the weight of the sample discs.

In the synthesis reaction, it is believed that the formation of the AlN starts from the surface of the shaped samples and subsequently, with the evaporation of the carbon monoxide in the shaped samples, proceeds to the inside of the shaped samples step by step. However, as in the process of lowering the temperature, the remaining impurity, oxygen, will react with the samples and oxidize the surface of the shaped samples. Although the partial pressure of the remaining oxygen is not very high, it is sufficient to form a thin layer of alumina on the shaped samples. Since the molar volume of the alumina (25.58 cm$^3$/mole) is greater than that of the aluminum nitride (12.57 cm$^3$/mole), this thin layer of alumina will act as a protecting layer to prevent further oxidization from proceeding to the inside of the shaped samples.

For the purpose of shaping the powder mixture into a compact smoothly, it is preferable that the mixture of alumina, carbon black, aluminum nitride and liquid dispersing medium is granulated before shaping the compact. The granulation of the powder mixture can be carried out using any conventional method, for example, adding 1 wt % of ethyl cellulose as binder to the pre-ground powder mixture, then grinding and screening the powder mixture with screens having 60, 80 and 100 meshes to granulate the powder mixture.

Figure 10:
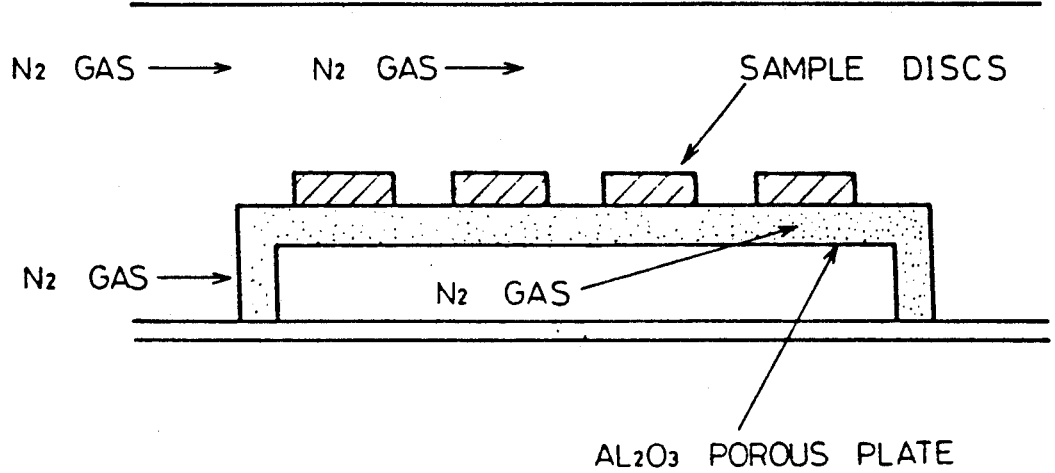
FIG. 10 is a schematic view of the apparatus for practicing the process of the present invention.
Figure 13A:
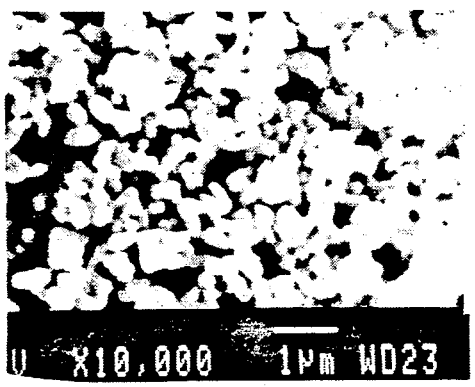
FIGS. 13A, 13B, 13C, 13D, 13E, and 13F are scanning electron microphotographs of the mechanically fractured surface of the sample discs of FIG. 12.
Figure 13B:
Figure 13C:
Figure 13D:
Figure 13E:
Figure 13F:

According to the process of the present invention, the discs are fed into a furnace and heated at a temperature of 1550° to 1650° C. in a nitrogen atmosphere with a flow rate of 100–300 cc/min. It is noted that, preferably, the discs are placed on a plate of porous structure and made of alumina. A schematic view of the apparatus for practicing the process of the present invention is shown in FIG. 10.

Figure 11A:
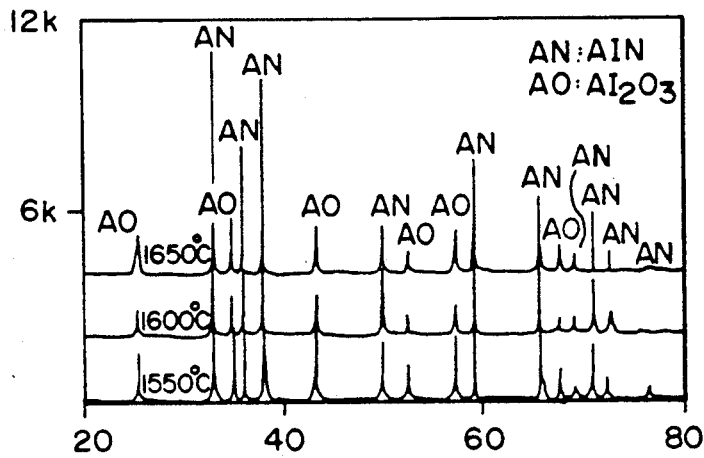
FIG. 11 is an X-ray diffraction diagram of the sample discs obtained by heating compressed powder mixture with a weight ratio of alumina to carbon being 2.83:1 at different temperatures.
Figure 11B:
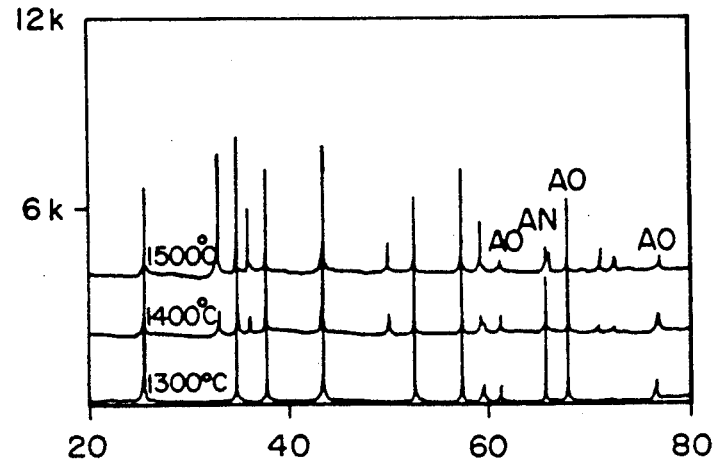

The range of the heating temperatures according to the process of the present invention is also investigated. Two groups of powder mixture are prepared; the first group is the theoretical group in which the weight ratio of the alumina to the carbon black is 2.83:1, while the second group is the comparative group in which the weight ratio of the alumina to the carbon black is 2.0:1. Several discs of 1 gram of the above two groups are respectively made by compressing the above two powder mixtures in a press machine. These sample discs are heated respectively at temperatures of 1300° C., 1400° C., 1500° C., 1550° C., 1600° C. and 1650° C. with soaking time of 7 hours in an atmosphere of nitrogen with flow rate of 200 cc/min for comparison. The X-ray diffraction diagrams of the heated sample discs are shown in FIG. 11 and FIG. 12. As shown in FIG. 11 and FIG. 12, for both groups, at 1300° C., only a little of AlN is formed, at 1400° C., the formation rate of AlN is still low, at 1500°–1550° C., the formation rate of AlN increases significantly, at 1600° C., the formation rate of the AlN is satisfactory, at 1650° C., the formation rate of AlN is slightly reduced. FIGS. 13A, 13B, 13C, 13D, and 13E are scanning electron microphotographs of the mechanically fractured surface of the above samples. As shown in these drawings, the powder synthesized at a temperature of 1300° to 1400° C. has an average particle diameter of about 0.5 micron, the powder synthesized at 1500° C. has an average particle diameter of about 0.5 micron, the powder sintered at 1550°–1600° C. has an average particle diameter of less than 1 micron, and the powder synthesized at 1650° C. has an average particle diameter of about 1 micron. This shows that the average particle diameter of the synthesized powder increases as the heating temperature is raised. From the results of FIG. 14, it is known that at a temperature of 1300° C. with a soaking time of 7 hours, only a little of alumina is converted into aluminum nitride. Therefore, 1300° C. can be considered as the starting temperature for the reaction of AlN. At 1500° C., the reaction rate is maximum, because the formation rate of the AlN is far greater than the formation rate at 1400° C. Above 1400° C., the reaction rate is gradually reduced, but the formation rate of AlN continues to increase. At 1600° C., the purity of the AlN in the synthesized powder is the highest (about 95%). Therefore, it is known that the heating temperature of 1600° C. is the optimum reaction temperature. Heating temperatures greater than 1600° C., for example 1650° C., will reduce the formation rate of the produced AlN.

Figure 15:
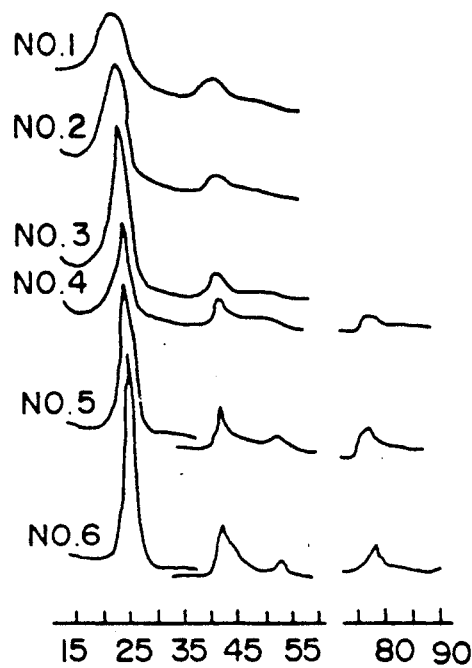
FIG. 15 shows the diffraction peak of the carbon black becoming sharp when the heating temperature is raised.

As for the reason why a heating temperature of 1650° C. will reduce the formation rate of AlN, it is believed that at 1650° C., the carbon black crystallizes, hence weakening its reducing ability. It is important that the carbon black used in the present invention should be an amorphous carbon black, because the amorphous structure is a short-range order structure, their bonding is not so strong, and the energy thus required for the formation or breakage of the bond is smaller. But, when the temperature is raised, the degree of crystallinity will gradually become large. As shown in FIG. 15, the diffraction peak of the carbon black becomes sharp when the temperature rises, i.e. crystallization occurs when the temperature is raised. Thus, at 1650° C., the degree of crystallinity of carbon black is greater than that at 1600° C., this will decrease the reducing ability and the formation rate of AlN. It can be predicted that at a temperature of above 1650° C., this phenomenon will become more significant.

The optimum soaking time according to the process of the present invention is also studied. Similarly, two groups of powder mixture are prepared: one is the theoretical group in which the weight ratio of the alumina to the carbon black is 2.83:1; the other is the comparative group in which the weight ratio of the alumina to the carbon black is 2.0:1. Several sample discs of 1 gram of the above two powder mixtures are formed and heated at a temperature of 1600° C. in an atmosphere of nitrogen (flow rate: 200 cc/min) with different soaking time, i.e. 1 hour, 3 hours, 5 hours, 7 hours, 10 hours and 12 hours.

Figure 16A:
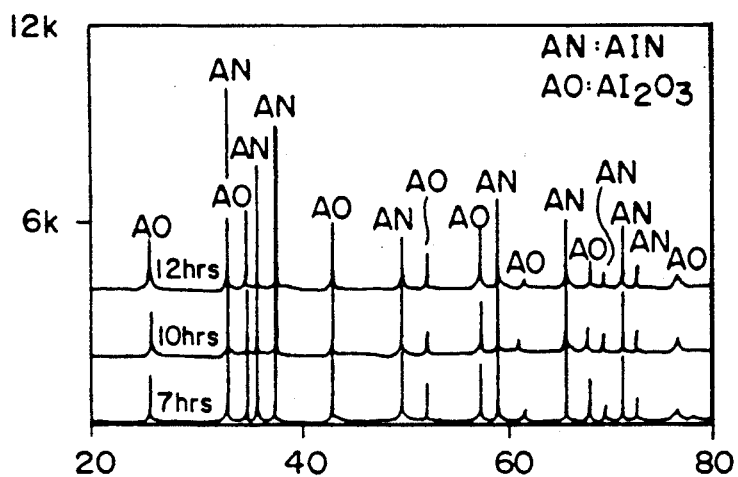
FIG. 16 is an X-ray diffraction diagram of the sample discs obtained by heating compressed powder mixture having a weight ratio of alumina to carbon being 2.83:1 at 1600° C. with different soaking time.
Figure 16B:
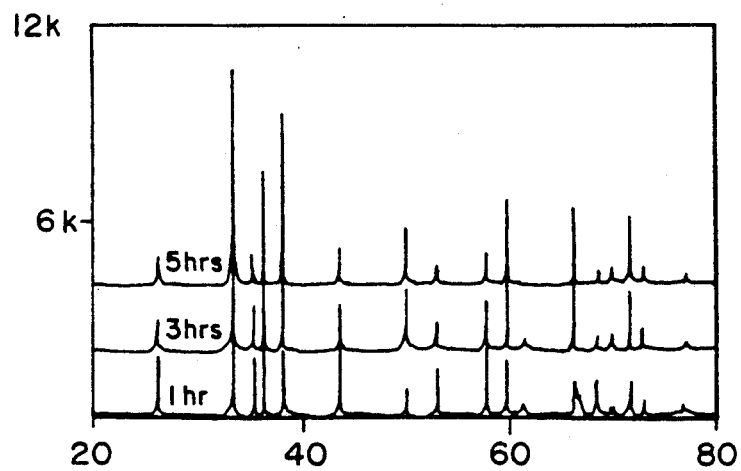

FIG. 16 is the X-ray diffraction diagram of the sample discs made by the powder mixture of the theoretical group. As indicated in FIG. 16, 3 to 5 hours of soaking time is optimum, less than 3 hours (e.g. 1 hour) will lead to insufficient reaction, and greater than 5 hours (e.g. 7, 10, 12 hours) will reduce the formation rate of the AlN. It is believed that from 1 to 5 hours, the reaction proceeds positively and gradually reaches the maximum (at 5 hours). At this time, even prolonging the soaking time will not increase the formation rate of AlN. On the contrary, it will prolong the retention time of the sample discs in the heating zone, thereby increasing the possibility of reoxidization of the surface of the sample discs. As for the phenomenon that the intensity of the diffraction peaks with 7 to 12 hours of soaking time varies slightly, it is due to the fact that the molar volume of the alumina is greater than that of the aluminum nitride as stated previously, so that at a specific temperature, the surface oxidization layer is about the same, because oxidization to the inside will be obstructed by the surface oxidization layer.

Figure 17A:
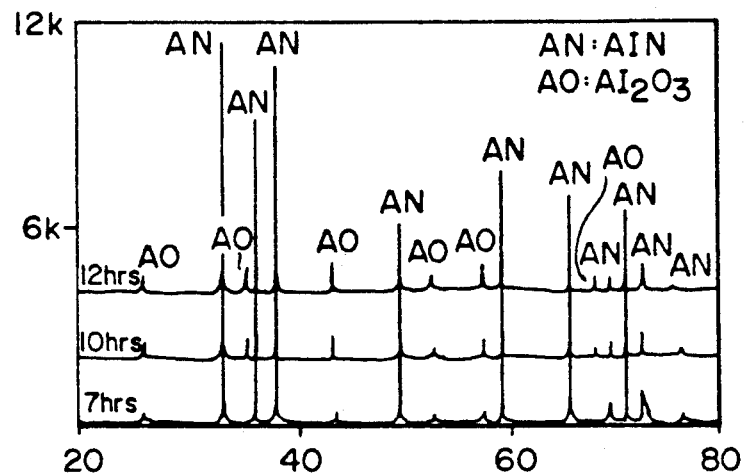
FIG. 17 is an X-ray diagram of the sample discs obtained by heating compressed powder mixture having a weight ratio of alumina to carbon black being 2.0:1 at 1600° C. with different soaking time.
Figure 17B:
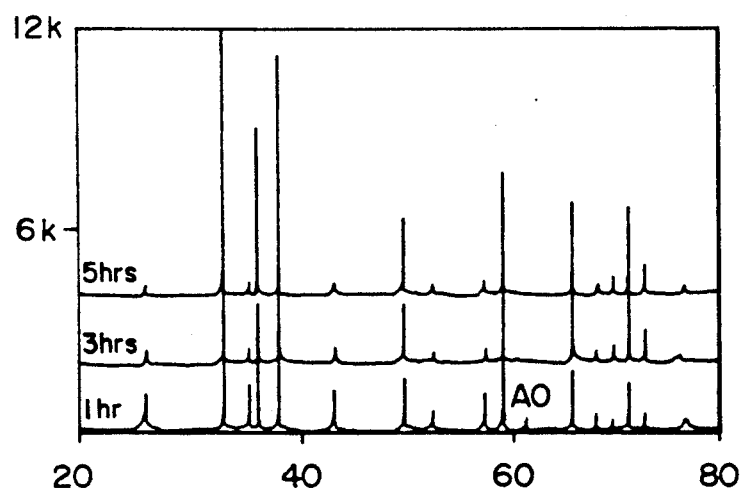

FIG. 17 is the X-ray diagram of the sample discs prepared from the powder mixture of the comparative group. As can be seen from FIG. 17, the purity of the AlN is rather high even if the soaking time is only 1 hour. This is because the excessive carbon black provides a greater chance for reduction and therefore accelerates the reaction. It is also observed from FIG. 17 that the optimum result is obtained with a soaking time of 7 hours, rather than 5 hours. This is because after 5 hours, there is still some unreacted carbon remaining in the center of the sample disc, and this unreacted carbon will still react with oxygen to form carbon monoxide and evaporate, allowing the nitrogen to enter into the aluminum nitride powder to obtain a more perfect reaction.

Figure 18A:
FIGS. 18A, 18B, 18C, 18D, 18E, and 18F are scanning electron microphotographs of the mechanically fractured surface of the sample discs obtained by heating compressed powder mixture having a weight ratio of alumina to carbon black being 2.0:1 at 1600° C. with different soaking time.
Figure 18B:
Figure 18C:
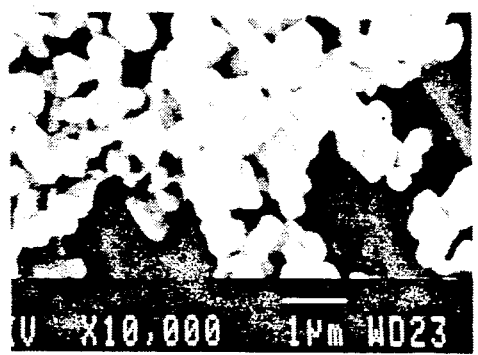
Figure 18D:
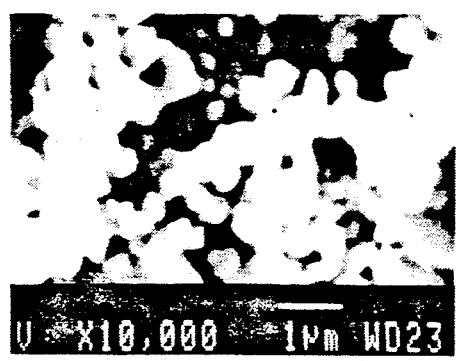
Figure 18E:
Figure 18F:
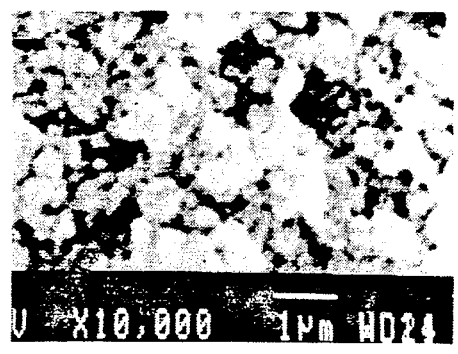
Figure 19A:
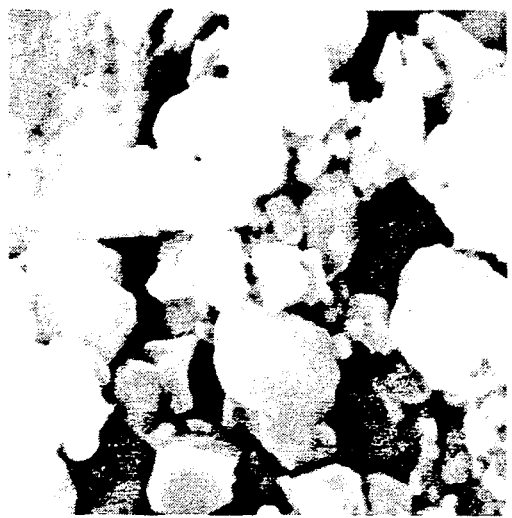
FIGS. 19A, 19B, 19C, and 19D are scanning electron microphotographs of the produced powder showing the influence of the flow rate of nitrogen on the formation rate of AlN.
Figure 19B:
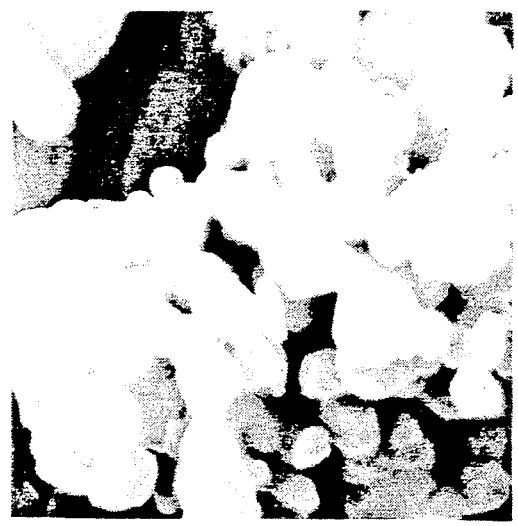
Figure 19C:
Figure 19D:
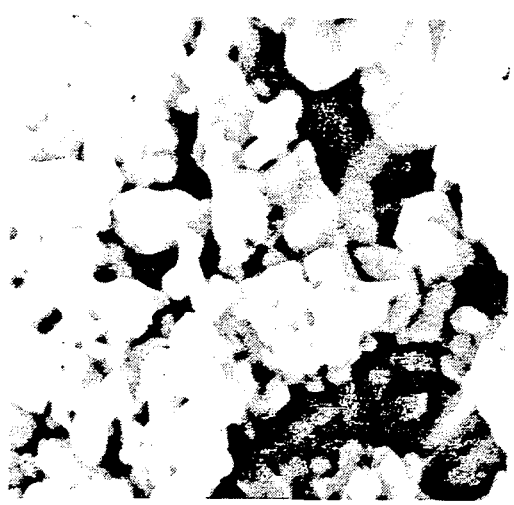

FIGS. 18A, 18B, 18C, 18D, 18E, and 18F are scanning electron microphotographs of the mechanically fractured surface of the sample discs prepared from the powder mixture of the comparative group. As shown in FIG. 18A, most of the particles have an average particle diameter of 0.2 to 0.4 micron. The shape of the particle of FIG. 18B to FIG. 18F is substantially the same; the average particle diameter increases with the increase in soaking time, but the average particle diameter is still in the range of submicron.

Figure 20:
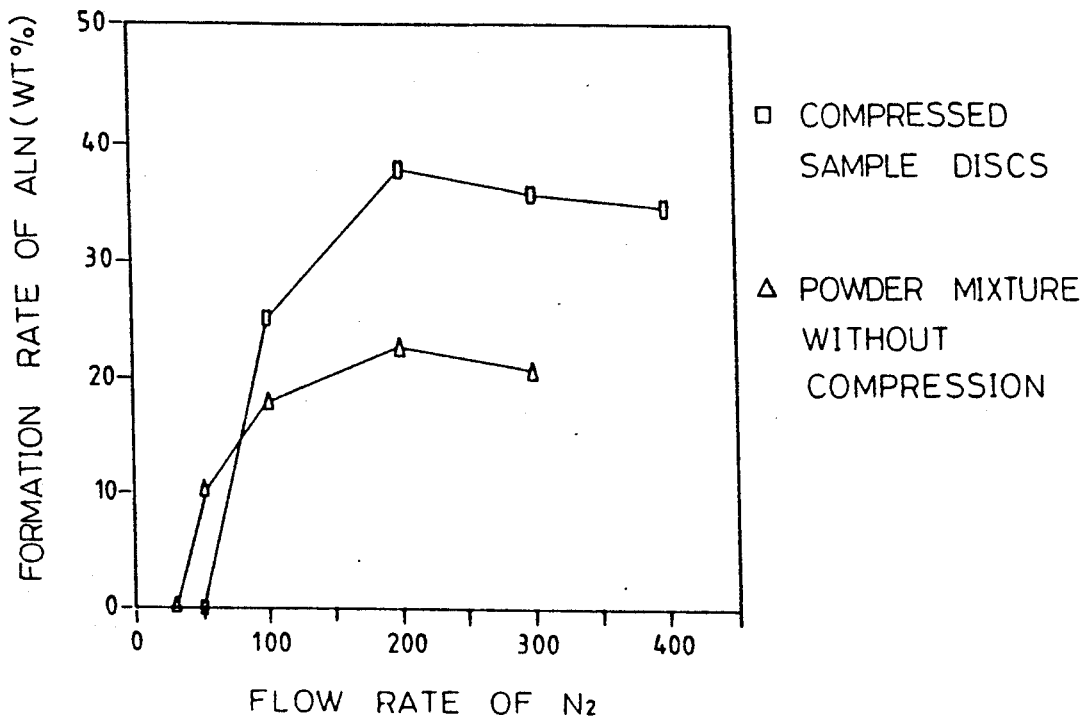
FIG. 20 shows the dependance of the formation rate of AlN upon the flow rate of the nitrogen gas.

In the synthesis of the aluminum nitride, the nitrogen gas acts as a reactive gas; therefore, the flow rate of the nitrogen gas is an important factor for the synthesis of the AlN powder. The influence of the flow rate of the nitrogen gas on the purity of the produced AlN powder is also studied. This study is carried out for both the compressed powder mixture and the powder mixture without compression. FIGS. 19A, 19B, 19C, and 19D are scanning electron microphotographs of produced powder mixture in which the weight ratio of alumina to carbon black is 2.0:1. Sample discs are prepared by compressing 0.3 gram of the powder mixture under a pressure of 1886 kg/cm$^2$, subsequently heated at a temperature of 1600° C. with a soaking time of 7 hours in an atmosphere of nitrogen with different flow rates. FIG. 20 shows the dependence of the formation rate of the AlN of the sample discs upon the flow rate of the nitrogen for both the compressed powder mixture and the powder mixture without compression. It is shown in FIGS. 19A, 19B, 19C, 19D and 20 that for powder mixture without compression, the formation of AlN starts at the flow rate of 50 cc/min, increases with the increase in the flow rate of nitrogen, and reaches a maximum at the flow rate of 200 cc/min, and for compressed powder mixture, similarly, the formation of AlN reaches a maximum at the flow rate of 200 cc/min and slightly reduced at the flow rate of 300 cc/min and 400 cc/min.

This result is believed to be caused by two factors: temperature difference and the concentration of nitrogen. The following reaction occurs in the alumina reducing method:

$$Al_2O_{3(s)} + 3C_{(s)} + N_{2(g)} \rightleftharpoons 2AlN_{(s)} + 3CO_{(g)}$$

Figure 21:
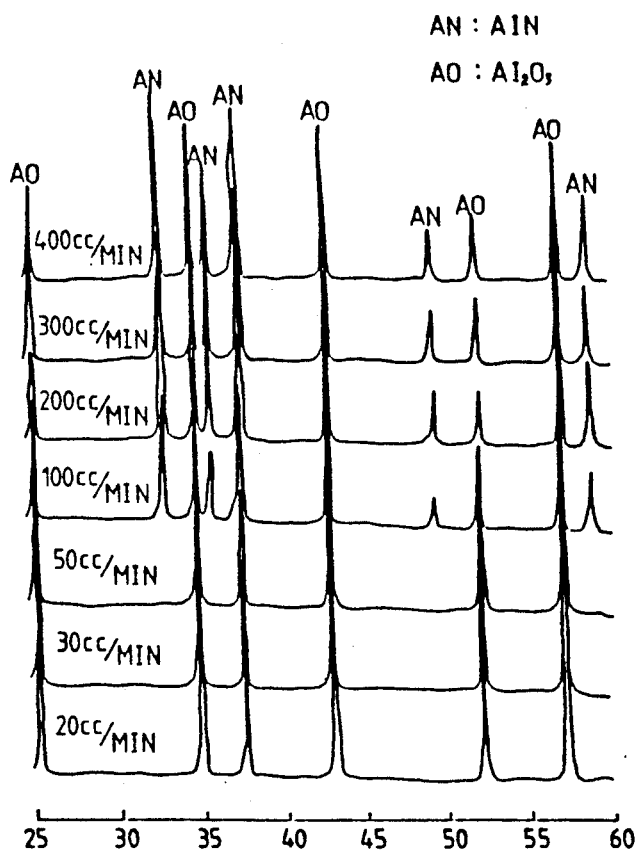
FIG. 21 is an X-ray diffraction diagram of the synthesized powder reacted at 1600° C. with different flow rates of nitrogen.

According to Le Chatelier's principle, when the flow rate of nitrogen (such as 20, 30 cc/min) is too small, this reaction tends to proceed from right to left, and therefore no AlN will form (see FIG. 21). When the flow rate of nitrogen is increased, the partial pressure of the nitrogen becomes large and the temperature difference in the reaction zone will become small due to the fast flow of the nitrogen therein. At this time, the formation rate of AlN will be influenced by these two factors. Thus, it is considered that the decrease in the formation rate of AlN is due to the fact that the adverse effect of temperature decrease is greater than that of the increase of the concentration of the nitrogen.

As the reducing agent, carbon black, will not react completely with the alumina in the alumina reducing reaction, it is therefore preferable that the resulting powder is subjected to further heat treatment to remove the unreacted carbon. This heat treatment is usually carried out at a temperature of 600°–700° C. for 5 to 7 hours.

The mechanism of the process according to the present invention is still not well ascertained by the inventors of the present invention, but they believe that it comprises the following two parts:

(I)

$$Al_2O_{3(s)} + 2C_{(s)} \rightarrow Al_2O_{(g)} + 2CO_{(g)}$$

$$Al_2O_{(g)} + C_{(s)} \rightarrow 2Al_{(g)} + CO_{(g)}$$

$$2Al_{(g)} + N_{2(g)} \rightarrow 2AlN_{(s)}$$

(II)

$$Al_2O_{3(s)} + 2C_{(s)} \rightarrow Al_2O_{(g)} + 2CO_{(g)}$$

$$Al_2O_{(g)} + C_{(s)} + N_{2(g)} \rightarrow 2AlN_{(s)} + CO_{(g)}$$

Figure 22:
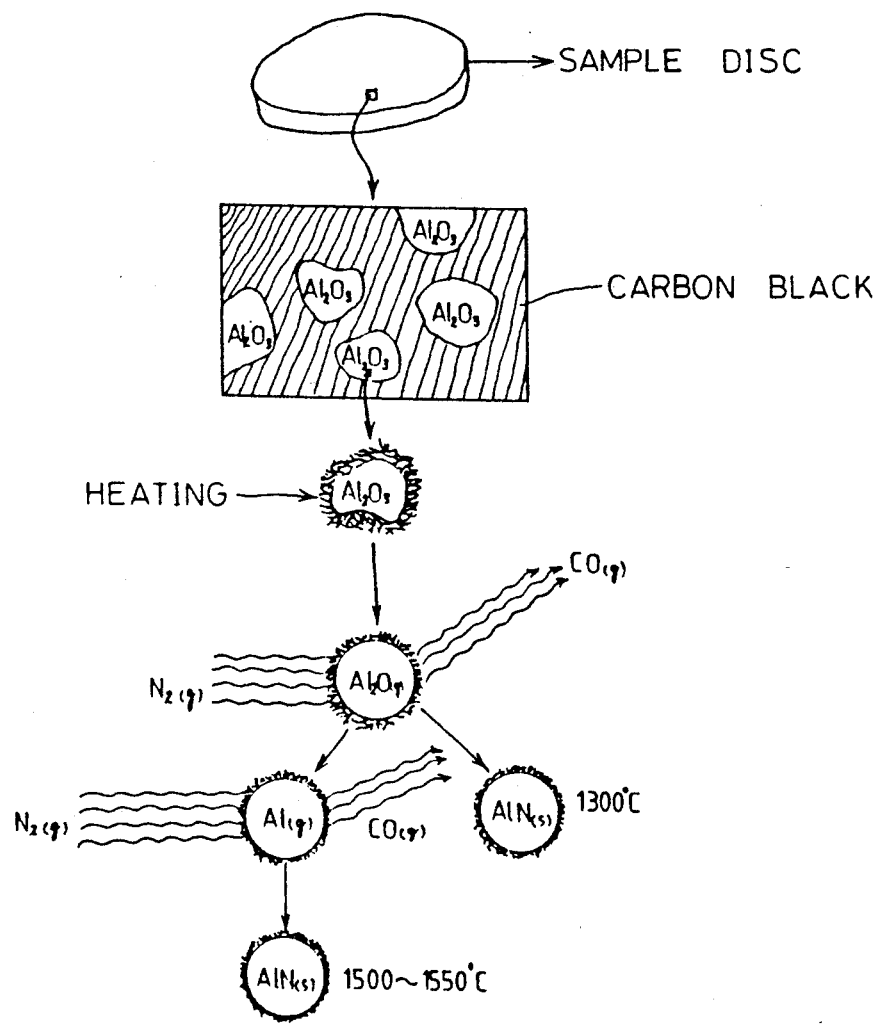
FIG. 22 is a schematic diagram illustrating the mechanism of the process of the present invention.

FIG. 22 further illustrates the mechanism of the process of the present invention.

The following example illustrates the process of the present invention more specifically.

EXAMPLE

Thirty grams of α phase alumina (Cricream) having a purity of 99.99% and an average particle diameter of 0.48 micron with the proportion of particles having a particle diameter of not more than 1 micron and being 80% by weight, and 15 grams of amorphous carbon black having an average particle diameter of 0.18 micron are mixed uniformly in anhydrous ethanol (Merck), which serves as a dispersing medium, for 3 hours in a ball mill filled with alumina balls of high purity. The resulting mixture is filtered, dried, and put into a mill for further grinding. Thereafter, 1, 3 and 5 weight percent (based on the total weight of alumina and carbon black) aluminum nitride (Tokuyama Soda Co.) having a purity of 98.1%, an average particle diameter of 0.6 micron, metal impurities of less than 200 ppm and oxygen content of 1 wt % are respectively added to the resulting mixture of alumina and carbon black.

To the mixture obtained is added 1 wt % of ethyl cellulose as a binder, uniformly ground in a mill and granulated successively by screens of 60 meshes, 80 meshes and 100 meshes.

The granulated powder is compressed into several discs (weight: 1 gram, diameter: 15 mm, thickness: 1 mm) under a pressure of 2830 kg/cm$^2$ and heated at a temperature of 1600° C. with a soaking time of 7 hours in an electric furnace while continuously feeding nitrogen gas into the furnace at a rate of 200 cc/min. The resulting sample discs are heated at a temperature of 700° C. for 5 hours to remove the unreacted carbon.

Observation using a scanning electron microscope shows that the resulting powder has an average particle diameter of 0.4 micron.

Figure 6A:
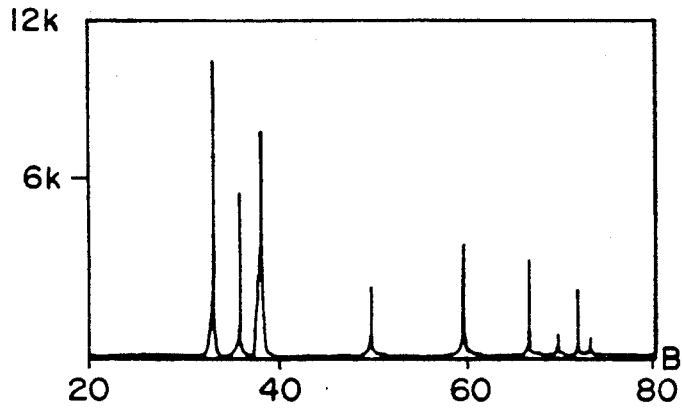
FIG. 6A is an X-ray diffraction diagram of the powder prepared by the process disclosed in the Japan laid-open Patent Publication No. 57-207814.
Figure 6B:
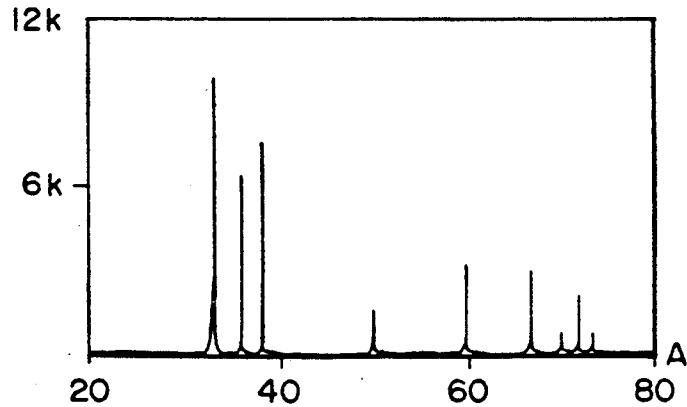
FIG. 6B is an X-ray diffraction diagram of the powder prepared by the process as set forth in example 1 of the present invention.

Further, X-ray diffraction analysis of the resulting powder shows that with no addition of AlN powder, several diffraction peaks of alumina are present, with the addition of 1 wt % of AlN powder, several diffraction peaks are still present, but their intensity is weak, and with the addition of 3 wt % AlN, no diffraction peaks of alumina are present. Comparing the X-ray diffraction diagrams of the powder prepared by the process disclosed in the Japan laid-open Patent Publication No. 57-207814 and that of the powder prepared in this example with the addition 5 wt % of AlN, no difference can be found between them (see FIG. 6A, FIG. 6B). As the powder prepared by the process described in the Japan laid-open Patent Publication No. 57-207814 has a purity of 98.1%, it is believed that the aluminum nitride powder prepared by the process of the present invention also has a purity of 98.1%.

What is claimed is:

1. A process for producing an ultrafine powder of aluminum nitride, which comprises:
    (a). intimately mixing α phase fine powder of alumina having an average particle diameter of about 0.48 micron, a fine powder of carbon having an average particle diameter of about 0.18 micron and a powder of aluminum nitride in a liquid dispersing medium, wherein the weight ratio of the fine alumina powder to the fine carbon powder is from 1.6:1 to 2.5:1 and the amount of the aluminum nitride added is 1–5 wt % based on the total weight of the alumina powder and the carbon powder;
    (b). compressing the resulting mixture into a molded article;
    (c). heating the molded article at a temperature of 1550° to 1650° C. in an atmosphere of nitrogen; and
    (d). heating the resulting powder at a temperature of 600° to 700° C. for 5–7 hours to remove the unreacted carbon.

2. The process as claimed in claim 1, wherein the weight ratio of the fine alumina powder to the fine carbon powder is 2.0:1.

3. The process as claimed in claim 1, wherein between steps (a) and (b) is further included a step of granulating the resulting powder mixture.

4. The process as claimed in claim 1, wherein the molded article of step (b) is formed by applying 1000–4000 kg/cm$^3$ pressure to 1 gram of the resulting mixture so as to obtain a disc having a diameter of 15 mm and a thickness of 1–5 mm.

5. The process as claimed in claim 4, wherein the compressing pressure is 2830 kg/cm$^3$.

6. The process as claimed in claim 1, wherein the heating temperature in step (c) is 1600° C.

7. The process as claimed in claim 1, wherein the flow rate of the nitrogen is 100–300 cc/min.

8. The process as claimed in claim 1, wherein the heating in step (c) is effected by placing said shaped article on a porous plate of alumina.

9. The process as claimed in claim 1, wherein the heating in step (c) is continued for 3 to 5 hours.

10. A process for producing an ultrafine powder of aluminum nitride having an average particle diameter of 0.45 micron and a substantially globular grain form, which comprises:
    (a) intimately mixing α phase fine powder of alumina having an average particle diameter of about 0.48 micron, a fine powder of carbon having an average particle diameter of about 0.18 micron and a powder of aluminum nitride, in a liquid dispersing medium, wherein the weight ratio of the fine alumina powder to the fine carbon powder is from 1.6:1 to 2.5:1 and the amount of the aluminum nitride added is 1–5 wt % based on the total weight of the alumina powder and the carbon powder;
    (b) compressing the resulting mixture at a pressure of 1000–4000 kg/cm$^3$ to form a molded article having a thickness of 1–5 mm;
    (c) placing the molded article on a porous, alumina plate;
    (d) heating the molded article at a temperature of 1550° to 1650° C. in an atmosphere of nitrogen; and
    (e) heating the resulting powder at a temperature of 600° to 700° C.

* * * * *